(12) United States Patent
Boden (10) Patent No.: US 9,835,654 B2
(45) Date of Patent: Dec. 5, 2017

(54) CURRENT-MEASUREMENT DEVICE

(71) Applicant: COMMISSARIAT À L'ÉNERGIE ATOMIQUE ET AUX ÉNERGIES ALTERNATIVES, Paris (FR)

(72) Inventor: Robert Boden, Dourdan (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/509,988

(22) PCT Filed: Sep. 3, 2015

(86) PCT No.: PCT/FR2015/052330
§ 371 (c)(1),
(2) Date: Mar. 9, 2017

(87) PCT Pub. No.: WO2016/038281
PCT Pub. Date: Mar. 17, 2016

(65) Prior Publication Data
US 2017/0254837 A1    Sep. 7, 2017

(30) Foreign Application Priority Data
Sep. 10, 2014  (FR) ...................................... 14 58486

(51) Int. Cl.
*G01R 19/00* (2006.01)
*G01R 15/14* (2006.01)
(Continued)

(52) U.S. Cl.
CPC ......... *G01R 19/0061* (2013.01); *G01R 15/14* (2013.01); *G01R 19/0092* (2013.01); *G01R 29/24* (2013.01); *H03F 3/45475* (2013.01)

(58) Field of Classification Search
USPC ................ 324/76.11, 669, 684, 720, 207.12; 327/101, 102; 250/281, 282
See application file for complete search history.

(56) References Cited

U.S. PATENT DOCUMENTS 3,872,287 A * 3/1975 Koeman ................... G01T 1/36
250/336.1
5,770,956 A    6/1998 Rolff
(Continued)

FOREIGN PATENT DOCUMENTS

EP          0 436 777 A2    7/1991
WO    WO 2010/109347 A1    9/2010

OTHER PUBLICATIONS

International Preliminary Report on Patentability and the Written Opinion of the International Searching Authority as issued in International Patent Application No. PCT/FR2015/052330, dated Mar. 14, 2017.

(Continued)

Primary Examiner — Vincent Q Nguyen
(74) Attorney, Agent, or Firm — Pillsbury Winthrop Shaw Pittman LLP (57) ABSTRACT

A device for measuring very low current closes to femto Ampere using an integration, includes a first operational amplifier connected as an integrator, and a second operational amplifier connected as an original current generator which can compensate for leakage current in the circuit measurement state and reset the QO charge of the integration capacitor in the reset state.

7 Claims, 5 Drawing Sheets (51) Int. Cl.
    *H03F 3/45*          (2006.01)
    *G01R 29/24*       (2006.01)

(56) References Cited

U.S. PATENT DOCUMENTS

| | | | |
|---|---|---|---|
| 7,436,165 B2 * | 10/2008 | Ouvrier-Buffet | ......... G01T 1/17 |
| | | | 324/76.11 |
| 2005/0105309 A1 | 5/2005 | Fujisaki et al. | |
| 2005/0105310 A1 | 5/2005 | Miyake | |
| 2014/0174145 A1 | 6/2014 | Chen et al. | |

OTHER PUBLICATIONS

"Devices for optimizing low current measurements," Published in *The Revue Polytechnique*, Nov. 2013, Jan. 10, 2014, 3 pages, <http://www.polymedia.ch/RpArticles/view/336>.
International Search Report as issued in International Patent Application No. PCT/FR2015/052330, dated Nov. 20, 2015.

\* cited by examiner

CURRENT-MEASUREMENT DEVICE

CROSS-REFERENCE TO RELATED APPLICATIONS

This is the U.S. National Stage of PCT/FR2015/052330, filed Sep. 3, 2015, which in turn claims priority to French Patent Application No. 1458486, filed Sep. 10, 2014, the entire contents of all applications are incorporated herein by reference in their entireties.

TECHNICAL FIELD OF THE INVENTION

The invention relates to a current-measurement device, and more particularly a device for measuring current by means of integration, and more specifically the measurement of very low currents, close to the femto ampere. Furthermore, this device is preferentially intended to interface an ionisation chamber, used for radioprotection detectors or dose measurers for medical purposes, which proceed by means of integration. This device is furthermore able to apply to the measurement of currents within very high resistances, or the measurement of leakage resistances of the insulators or isolators.

PRIOR ART

Measuring current by means of integration is favoured for the measurement of very low currents, that can go down to the femto ampere with integration times of about a minute for a measurement of a few fA.

The measurement of ionising radiation can be carried out by means of three major families of devices: ionisation chambers, proportional meters and Geiger counters.

An ionisation chamber is comprised of two conductive surfaces, planar or coaxial, separated by a gaseous dielectric. These two conductive surfaces are polarised by a direct voltage of about 100 v/cm. The particles or ionising radiation generate pairs of ions (electron-nucleus), with the whole acting as a current source, with internal resistance exceeding $10^{15}$ Ohms. The low current generated is proportional to the ionisation. A dielectric comprised of air, at atmospheric pressure, generates as such, for each volume unit of a dm3, a current of $10^{-14}$ A/µGy/h. Certain ionisation chambers are obstructed by lead shielding (metrology laboratory) in order to detect only what is coming from a given direction or volume. Indeed, the volume to be taken into account is that delimited by the irradiated zone, which may be smaller than the total volume between the electrodes. If the air pressure is increased, sensitivity increases in proportion since it depends on the quantity of gas molecules in the measurement volume separating the electrodes. As the chamber generates a current proportional to the irradiation, the input impedance of the acquisition circuit must be negligible before that of the ionisation chamber, so as to not introduce a voltage drop.

The volume of dielectric determines the sensitivity of the chamber. According to current industrial applications, the sensitivities of the ionisation chambers are of several types:
- for highly localised fields such as in curietherapy, of about a $cm^3$;
- for portable controls (Babyline™ type device) a half $dm^3$ (even less if the air is under pressure) in order to retain workability;
- for gas chambers, aiming to measure the radiation emitted by a radioactive gas that is made to circulate between the two electrodes of the chamber, the volume is about from a $dm^3$ to a dozen $dm^3$
- for irradiation chambers intended for measuring the ambient radiation of a nuclear building, where the sources can be multiple and are generally far away, it is important to capture as many as possible. The volume is then of a few $dm^3$ to several dozens of $dm^3$, The object of the invention does not however reside in these detectors themselves, but in a device for measuring very low currents by means of integration, of which a preferred application is to constitute the input electronics which can be placed in these radiation detection chambers and means for metering or for viewing carried out with more conventional electronics (for example C-Mos). After a brief reminder of these detectors, we shall therefore focus on the electronics that is associated with them in prior art, and its operating constraints.

An ionisation chamber assumes that the two electrodes are polarised by an ancillary voltage source, brought to a potential difference ranging from a few dozen volts to several hundred volts. The most common polarisation voltages for portable detectors with ionisation chamber are of a few hundred volts. When these ionisation chambers are subjected to a flow of particles or ionising radiation, pairs of charges with opposite signs occur in the volume of the dielectric gaseous material, and are attracted by the polarisation voltage to the electrode of the sign opposite their charge.

The term "ionisation chamber" is a generic term that can also designate the family of detectors comprised of ionisation chambers properly speaking, of proportional meters and of Geiger counters. In what follows, this expression will be used only to designate ionisation chambers properly speaking.

These ionisation chambers have very good proportionality between the energy deposited by the particles or ionising radiation passing through the chamber and the very low current that results from this, leading to their application in metrology. Their derivatives according to the temperature and the pressure, are well known and can be reproduced. In order to make use of these possibilities, it is therefore suitable to interface them with an electronic circuit having very low leakage currents, and stable over time. In this operating mode, it is not necessary for the polarisation voltage to be very stable, the response of the chamber is flat and therefore varies very little if the polarisation voltage varies. However, such low values are almost always measured by means of integration, and it is the integrator connection that requires very great stability of the supply voltage ($10^{-4}$). Indeed, this connection comprises a capacitor C of which the value, for example 100 pF, forms the integrating capacitor, in series with the protecting resistor. The circuit therefore over time integrates the charge Q=CV and the voltage V at the terminals of the capacitor C represents the integral of the current over time. But if the polarisation voltage varies, this polarisation voltage variation is distributed between the parasite capacitor of the ionisation chamber and the capacitor C of the integrator. A measurement by means of integration therefore requires a stability of the polarisation voltage that is as great as possible, which in most applications corresponds to better than $10^{-4}$. The supply voltage can be less stable if the capacitor of the integrator is high with respect to the parasite capacitor of the ionisation chamber.

When the charges produced are more numerous and when an instantaneous reading is desired, an integrator circuit is not used but a simple amplifier connected in transimpedance with a pure resistance.

A proportional meter uses an ionisation chamber in principle identical, polarised with a high voltage in such a way as to amplify the charges collected (in practice, an optimisation leads to a construction of the chamber that is a little different). The electrodes as such collect more charges than those initially formed by the ionising radiation. Each interaction produces a current pulse which is counted (metering no longer of charges but of pulses). So the electronics are no longer measuring by means of integration but by simple amplification and pulse metering. As these charges are highly amplified within the chamber by a coefficient that depends on the polarisation voltage. The latter must therefore be very stable as in the preceding case. In this case, this number of charges collected remains, after amplification, proportional to the energy deposited by the incident radiation.

A Geiger counter uses an ionisation chamber polarised at a voltage that is stronger than in the preceding case of the proportional meter, to the extent that the slightest interaction triggers a phenomenon of an avalanche of electrical charges on the electrodes, which produces a pulse. This discharge will be stopped by the polarisation voltage drop caused by the avalanche through a series resistor, and by the use of certain gases that have an "extinguisher" effect.

The stability of the supply voltage has much less influence. Each interaction produces a current pulse of the same amplitude which is counted (only the number of pulses carries information linked to the ionisation of the chamber). This type of measurement does not make it possible to differentiate the energy of the incident ionising radiation.

The detection electronics do not integrate, and is further simpler than that of a proportional chamber due to the high amplitude of the signal of the chamber. It substantially carries out a simple pulse count, of which the characteristics allow for the direct triggering of very basic meters.

Returning to the ionisation chambers, the measuring currents of about a few femto amperes in a stable manner, even less, within a reasonable time requires the simultaneous satisfying of constraints that are sometimes contradictory, in particular if large measurement ranges are sought. The expression "reasonable time" means in practice of about one second for a portable device that can be manipulated in zones that are potentially dangerous for the operator, or of about several dozens of seconds for a more precise metrology.

Recall that a circuit for measuring by means of integration is provided to be configured alternatively in two states with very unequal durations:

a longer measurement state, where the circuit integrates the signal presented at its input by means of an integrating capacitor, and a much shorter reset state, which places the integrating capacitor in the charge state where it was at the time of beginning the measuring by integration. According to prior art, this reset corresponds to a discharge of the integrating capacitor. According to the invention, this reset consists in putting the $Q_0$ initial charge state in order to carry out a measurement by means of integration in the best conditions. If for example the current to be measured tends to discharge the integrating capacitor, the device according to the invention comprises a current source which can place this capacitor in its maximum charge state compatible with the supply voltages, in order to benefit from the widest measurement range possible, and this without having to reverse the signal. We shall define the reset as the putting of the integrating capacitor back into the $Q_0$ charge state.

This reset, at the instant it is established, produces as output of a first amplifier a voltage $V_{Min}$ referred to as a low threshold, of which the absolute value is substantially equal to a first end of the voltage measurement scale that can accept the analogue input of the microcontroller. A voltage $V_{Max}$ referred to as high threshold is therefore defined of which the absolute value is the other end of the measurement of the measuring scale of the microcontroller.

Among the constraints is also the choice of the value of the capacitor used as the integrating capacitor. This capacitor must be of low loss and have great stability over time and according to the temperature. The capacitor will generally be used at low frequencies (<10 Hz). The value of the capacitor depends on the current to be measured and is of about a few pF to a few nF according to the measurement range. Styroflex type capacitors (copolymer of Styrene and of butadiene in metal thin metal sheets) are very suitable for this type of capacitor (which is sometimes referred to, by metonymy, as a capacitor, according to very frequent use in electronics). Mica capacitors are very stable, but their leakage current is more substantial and their use is not recommended for very long integration times. The integration times can vary from a few ms to several hours.

The charge/discharge speed is also a critical parameter. If the discharges are very frequent (several discharges/sec), the discharge cannot be done by mechanical switching, and imposes the use of electronic switching means. However currently there are no semiconductor devices for which the ratio between the resistance to the passing state and to the blocked state is sufficiently large so that such a circuit does not interfere with the integration process of a current of about a femto ampere in crippling proportions.

Furthermore, the charge/discharge speed depends on the intensity of the current to be measured. If it varies in large proportions, the optimum compromise will be even more delicate to find.

Returning to the ionisation chambers, their electronic circuits for measuring by means of integration are of three types according to whether it is a question of a use for measuring radioprotection, for high-precision metrological measurements or for portable radiology measurements.

Electronics for Current Measurement in Radioprotection.

For example: The CIEP 42 is a fixed ionisation chamber of a few liters, designed for the radioprotection of a building, not for metrological purposes. This chamber has dedicated electronics of which the diagram is provided in FIG. 1. It circumvents the delicate problems of sensitivity and of stability at very low currents by replacing the amplitude measurements with time measurements according to the process that follows.

The chamber is similar to a current source, with this current being quasi exclusively due to the ionisation of the dielectric (air). It is connected to the circuit via the protecting resistor R4 of 10 MOhms. The circuit of FIG. 1 receives the current resulting from the charges generated on the chamber. They are always of the same sign, according to the polarisation of the chamber. After having passed through the protecting resistor of 10 MOhms, they arrive on the "minus" input of an operational amplifier (OA) of which the "plus" input is connected to the ground. A capacitor C3, of very low value (4.7 pF) forms the integrating capacitor which transforms this OA into an integrator. At the output, a protection diode prohibits in the event of a problem a negative signal from degrading the inputs of the downstream logic circuit.

Figure 1:
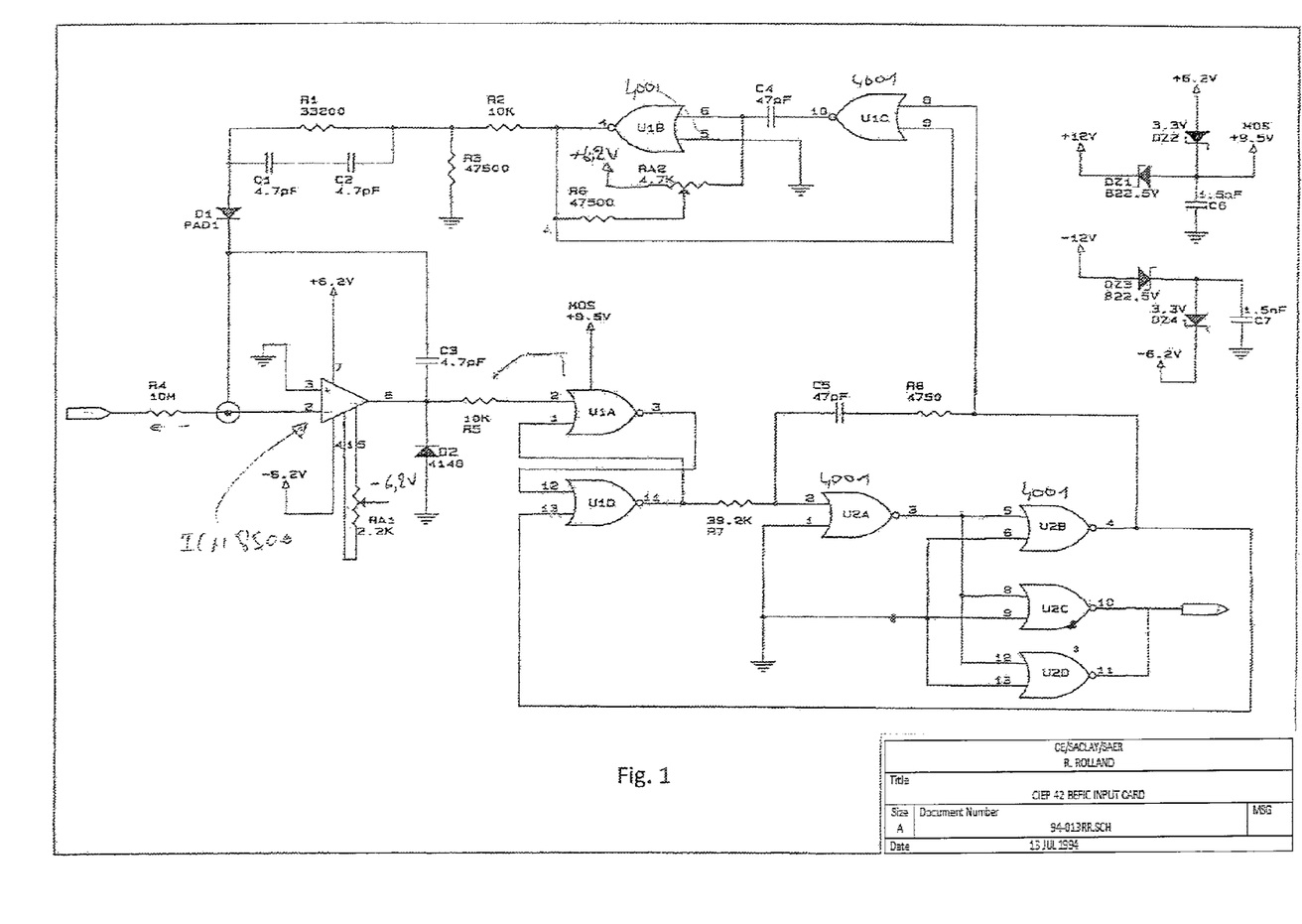
FIG. 1, a diagrammatical view of the electronics of an ionisation chamber of the CIEP 42 type constituting the first prior art mentioned.

The integration capacitor is charged according to the current coming from the ionisation chamber. This results in the necessity of electronically carrying out a discharge cycle and charging with the current to be measured. The control of this cycle is also electronic: the logic switches U trigger this cycle as soon as a voltage threshold is reached, and the discharge is carried out by the port U1B via an RC network that makes the diode D1 passing. In the range of use, the number of charge-discharge cycles can vary from a few discharges/h to 70,000 discharges/s.

The signal that is used in the end is the output 10 of the port U2C which delivers a pulse at each discharge cycle. A downstream device associates with each charge/discharge speed a value of the intensity initially emitted by the chamber. This circuit is suitable for the irradiations that are commonly encountered in nuclear facilities. The first purpose of this device is to carry out detection, not metrology. This type of operation by means of pulses prohibits knowing the intensity at an instant t: representative information is available only at the instant when a discharge cycle is triggered. Between two cycles, it is impossible to know what has happened since the end of the previous cycle.

On the other hand the diode D1 is of the PAD 1 type with low leakage current; but this current is even so of about a few dozen fA, which represents a lot when it is desired to measure a current of a few fA with precision.

Finally such a connection is sensitive to drifts, in particular thermal drifts. In particular, the diode D1 (PAD 1) has a very low leakage current, less than the pA, but the latter is even so greater than or equal to 20 fA. In reality, it is minimised by a slight polarisation of this diode, which optimises; but this polarisation is very sensitive to the temperature, of which the slightest variation destroys this optimisation and varies the leakage current. Here again, this does not make it possible to hope for a measurement of about a few fA, and stable.

The background noise measured by these electronics is of about two μgray per hour, i.e. about 20 to 40 times the natural ambient background noise in the Paris area. Most of this noise is generated on purpose by the adding of a radioactive source of Cs137 placed in the vicinity of the chamber. This is intended to generate a number of pulses that is sufficient to constantly ensure proper operation of the system, since it must function without the control of an operator.

This circuit of which the integrator operation is based on a systematic full charge of a low capacitor of which the peak value sends a pulse, with the sequencing of the various pulses determining the output signal Z is practical for providing an alert signal above a certain threshold (which can reach 70,000 charges/discharges per second. It remains operational in the case of very high flow rates of dose incompatible with human life in the event of a nuclear accident) and for example makes it possible to react at lower levels in order to trigger the evacuation of the personnel. On the other hand, it does not constitute a genuine integrator amplifier as it is not the level of analogue charge of the integrating capacitor that determines the output signal. That is why this system cannot be used in metrology, in particular for precise and stable measurement of currents of about the fA, for the following reasons:

as it does not work with integration of an analogue magnitude but by simple counting of pulses, with each one corresponding to a certain number of pico coulombs, there is no way to continuously know the measurement of the current between two pulses; however such a continuous measurement of the current constitutes the main interest of an ionisation chamber used in metrology.

it requires an adjustment of the leakage current that necessarily depends on the dispersion of the components, their ageing and especially the ambient temperature; more generally, these leakage currents are substantial and difficult to control.

in order to minimise the artefacts, the OA is at a very high input impedance of about $10^{14}$ ohms, however such components are extremely sensitive to electrostatic fields, imposing a complex and expensive implementation (bracelets connected to the worktop and to the ground) and the price of the component itself is high (approximately 40 to 50 E a piece)

the input leakage currents are about a few 10 fA but the output can fluctuate with the temperature, in particular by sliding the operation point of the diode D1

A pulse corresponds to a few pico coulombs. But the device does not make it possible to follow the change between two pulses. If the doses are very low, the succession of output pulses can exceed several dozen minutes. In this case the signal would be merged with the noise if the manufacturer had not placed in the ionisation chamber itself a micro source of caesium 137 intended to generate a minimum reference signal, which is roughly known, but with a precision that is insufficient to deduce a useful signal from it.

This device is therefore practical for providing an alert signal, but it cannot be suitable for metrology, in particular for very low doses.

An alternative of this was given by the Haute Ecole d'Ingénierie and de Gestion du Canton de Vaud (HEIG-VD), in Switzerland, and published in the Revue Polytechnique of November 2013. (see http://www.polymedia.ch/RpArticles/view/336). The principle is the same: beyond a certain load threshold of the integrating capacitor, a comparator emits a pulse representing a counting increment, and this pulse is also used as a reset via short-circuiting of the integrating capacitor, as in CIEP 42. Sharing the same principle, it also shares the disadvantages hereinabove that stem directly from this principle. Besides this, a very complex improvement was introduced in order to decrease the "main disturbances" that would be "of the electromagnetic type". According to our experience, this is in no way the case and we have the basis to consider that these disturbances that affect their circuit result in the use of a static switch (with semiconductor) of which the leakage currents in the open state are substantial with respect to the currents to be measured. This is to short circuit the integrating capacitor. In order to limit this problem, the device adds a periodical inversion stage of the electrodes of the current to be measured, at a frequency that is not mentioned but presumably synchronised with the reset pulses. This requires taking a certain number of measurements with this current in a certain direction, then an equivalent number of measurements with the opposite direction. This improvement therefore introduces a new constraint: the current to be measured must be rigorously stable for 60 seconds. This does not correspond at all to the conditions for measuring the current of an ionisation chamber (in the broad sense), where the measurand of course changes freely and continuously.

Electronics for Current Measurement in High-Precision Metrology,

The metrology is carried out by a device of the LNHB (Labo National Henry Becquerel) or LNE (Labo National d'Essai) type, devices that are comparable, very expensive and that have the volume of an electronic rack.

At LNHB, the measuring bench is dedicated to the precise calibration of the ionisation chambers ("primary", i.e. reference laboratory), in particular for hospital facilities. The electronics portion is comprised of a Keithley device for measuring very low current. The circuit has an input impedance $>10^{14}$ Ohms. (1 TeraOhm=$10^{12}$ Ohms). The integrating capacitor is comprised of a standard capacitor outside of the device. The background noise of the system is about 1/10 of fA (1 fA for the invention with a cost 100 times less).

Figure 2:
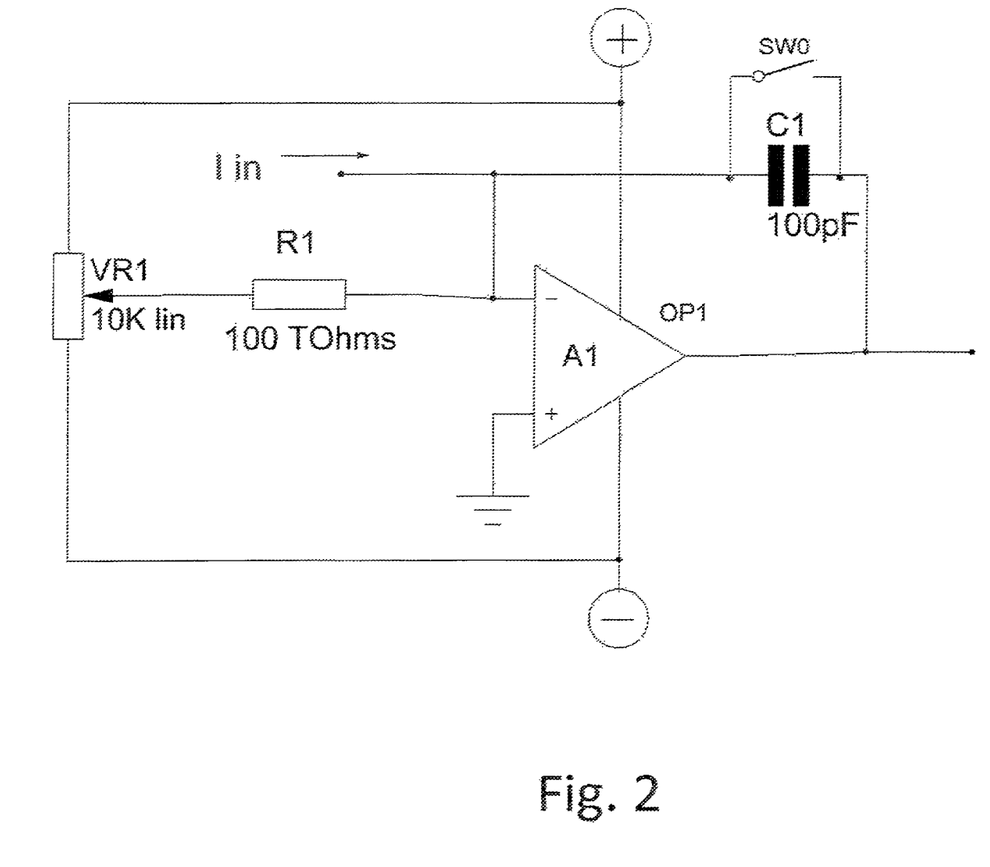
FIG. 2, a diagrammatical view of the circuit for adjusting leakage currents according to the other prior art mentioned (metrology and Babyline)

In accordance with FIG. 2, the capacitor C1 comprising the integrating capacitor is discharged by an electromechanical relay SW0 in series with a current limiting resistor.

At LNE, the electronic portion that interfaces the chamber is carried out by a prototype circuit developed using an operational amplifier of metrological quality, connected in an integrator circuit very close to that of LNHB. The operational amplifier has an input impedance $>10^{14}$ Ohms. (1 Teraohms=$10^{12}$ Ohms), which is stable over time. The integrating capacitor is comprised of a standard outside capacitor. The background noise of the system is about 1/10 of fA (1 fA for the invention with a cost 100 times less).

In these two cases, the standard capacitors used are expensive. Moreover, they are used jointly with standard resistors which are themselves very expensive (for example about fifty euros instead of a few euro centimes), their management is complex (limited stocks requiring orders that are planned in advance) and this complexity and these costs are poised to increase. Finally, it is delicate to manipulate them, requires the use of gloves as the lipoprotein film as well as the mineral salts and the moisture left by human skin form a non-negligible leakage resistance before the marked value.

The discharging of the capacitor constituting the integrating capacitor is done through electromechanical switching which short-circuits this capacitor, most often via a limitation resistance of the current. This switch must have high performance in order to not induce micro-outages. It generally requires gold contacts, in such a way that its cost is high and can only increase. In the case of the LNE, the control current of the short-circuiting relay is deemed as excessively disturbing, in such a way that the control coil was replaced with a permanent magnet displaced by a stepper motor. These components are very expensive, and these costs can only increase rapidly in the future.

The choice of the value of the integrating capacitor is linked to the amplitude of the current to be measured. If the capacitor is small, the connection will be more sensitive to any fluctuations in the polarisation voltage of the chamber. Indeed, the parasite capacitor of the chamber, which can be modelled by a capacitor in parallel with the current source, creates with the capacitance of the integration capacitor in series a capacitance bridge that divides the fluctuations of the polarisation voltage.

If the capacitor is large, its stability over time is greater using the same technology, but the measurement times are longer.

The LNE and LNHB have different objectives. They choose the value of the capacitor in consequence.

The LNE is dedicated to measurements of very low currents, for example for ampere meter calibrations or standard resistors of a very high value (greater than the TOhm). It therefore uses a minimum integrating capacitor of about 0.1 to 1 pF. In light of this very small value, it must take innumerable precautions, and in practice carry out a differential capacitor of which the dielectric is a dry gas, delimited by guard rings. The whole is connected to the circuit by a shielded cable. This type of device, aiming to optimise performance at almost no price obviously cannot be considered in an industrial product.

The LNHB is dedicated to the calibration of radiation fields or ionisation chambers for hospitals. In light of the existence of X-pulse generators of certain devices, it must be possible to receive the dozens of pC or the nC that result from this on the ionisation chamber, without the integration circuit saturating. Because of this, it has to use a larger capacitor. In practice it uses capacitors of at least 300 pF.

Portable detectors of the Babyline™ type used as integrators use integrating capacitor of a few nF. Indeed, they must be able to cover a very wide range of flow rates of dose without saturation and without switching to another capacitor. Furthermore, its discharge is mechanical, carried out by an operator, which does not allow for a high resetting speed.

These devices have an input circuit with an operational amplifier, of which the offset is adjusted by a voltage divider between the supply voltages, in accordance with FIG. 2.

Measurement in Portable Radiology.

A device that is well known and appreciated by professionals is the Babyline™. This device has an ionisation chamber with a volume of about half a liter (500 cm³) supplied by a polarisation voltage of about 300 V, and two current-measurement circuits that can be switched manually: either a current measuring by means of integration or a measurement by amplification connected as transimpedance, but which requires a standard resistor of a very high value (higher than the TOhm) which is very expensive and difficult to handle.

The Babyline™ as an integrator operates like the device of the LNHB or LNE, with the exception that the mechanical discharge device is a rotating manual switch. The input impedances are comparable, with the difficulty linked to the installation of components that are ultrasensitive to electrostatic charges that impose bracelets connected to the ground and to the workbench. As the operational amplifier was not at the time of design an integrated component, the amplification is done with discrete components, FET in the past and now Mosfet. Furthermore, some of these components are increasingly rare and increasingly expensive.

A switch with gold contacts makes it possible to switch to direct measurement without integration. The amplifier is then connected as a transimpedance amplifier, converting a current into voltage. This connection allows for a direct measurement of the instantaneous dose, while the conventional device with an integrator requires a derivation in order to obtain the instantaneous signal.

This Babyline™ further requires, for its transimpedance measurement, the use of standard resistors of high value, expensive and fragile, sensitive to the temperature. They furthermore require great precautions to manipulate.

Its input circuit, initially with FET then in a later version with Mos-FET, also comprises an adjustment of the leakage currents by a voltage divider between the supply voltages and a high-value resistor.

Other devices with lesser performance retain the same block diagram, but the components are less expensive and/or less carefully connected. The electromagnetic discharge switch is sometimes carried out by means of static switches, but the ratio between their resistance to the passing state and to the conductor state is much too low to not significantly affect the prevision of the measurements. In particular, its resistance in an open circuit does not reach the minimum value of 100 TOhms. And they induce excessive leakage currents and not constant enough to be offsettable.

In order to measure currents of about a few fA, the impedances of some components have to be very high (>100 TOhms), an integrator comprises an integrating capacitor that has to be discharged regularly to a very precise value and which can vary according to the application. A mechanical relay placed in parallel can fulfil this function, an electronic switch has an impedance in open circuit that is too low (at best about a TOhm) and induced excessive leakage currents.

To summarise, prior art is divided into two branches. The first branch avoids genuine measuring by means of integration by choosing to charge and discharge a capacitor of low value very quickly, with the measurement then being no longer carried out directly by analogue integration but indirectly by the counting of the charge/discharge cycles. The performance is not as high but this allows for the use of switching electronics without so high performance in terms of resistance between the passing state and the blocked state, and to switch several thousand times a second in order to discharge the integration capacitor.

All of the other circuits, more concerned with the accuracy and with the representativeness of the measurement, share the same disadvantages, even if those of the LNE and of the LNHB, much more recent, are based on passive components with very high performance, operational amplifiers of metrology and switches also with high performance. These disadvantages primarily stem from the fact that a switching intervenes in parallel with the integration capacitor (i.e. the capacitor of which the capacity constitutes the integrating capacitor) or in series between this integration capacitor and the operational amplifier that is associated with it at the time of reset (i.e. the charging of the integration capacitor in its $Q_0$ initial charge state before the measurement). For these devices of prior art, either the circuit is cut off by a switch in series between the integration capacitor and the associated operational amplifier, or a short-circuit is carried out between the terminals of this capacitor (possibly via a low resistor that limits the current to a value that does not damage this component). All of the connections between this integration capacitor (by metonymy this integrating capacitor) and the operational amplifier changes therefore between the integration state and the reset state.

It stems from the limited performance, of which we have strived to push back the limits through the use of very high-performance components, increasingly expensive, and of which the delicate implementation requires highly qualified manpower that complies with constraining conditions.

Disclosure of the Invention

The invention aims to remain in the framework of a genuine analogue measuring by means of integration, in accordance with the second branch of prior art (Babyline, LNE, LNHB), this without introducing any modification in the connections of the integration capacitor (by metonymy integrating capacitor), or on itself (no short-circuit), or with the associated operational amplifier (no series switch) between the measurement state of the circuit and its reset state. This, using only low-cost components and of which the cost is likely to decrease, while the electronics of prior art use very expensive components and of which the cost is likely to increase in the future.

In other terms, the invention carries out the integration by a circuit wherein the integration capacitor (by metonymy the integrating capacitor) is connected in the same way in the integration state and in the reset state. There is no way that makes it possible to short-circuit its electrodes for the resetting of the integrator.

The invention as such proposes a device for measuring a current by means of integration, said device comprising:
- a first operational amplifier OP1 comprising a first inverting input, with the current to be measured being applied on said first inverting input;
- an integration capacitor arranged between the first inverting input of the first operational amplifier OP1 and the output of this first operational amplifier;
- an active current source connected to the first inverting input of the first operational amplifier OP1, with this current source being configured to:
  - in a first measurement state of the device, compensate for leakage current of the device;
  - in a second reset state of the device, triggered by the charge value of the integration capacitor substantially equal to a maximum value QMax that it can have, generate a current which can return this charge to its initial value $Q_0$;
- means for controlling configured to:
  - memorise a $Q_0$ initial charge state corresponding to a voltage $V_{C0}$ at the output of the first operational amplifier;
  - place the device in the measurement state and keep it there until the charge of the integration capacitor substantially reaches $Q_{Max}$, corresponding to a voltage $V_{CMax}$ at the output of the first operational amplifier;
  - when the charge of the integration capacitor substantially reaches $Q_{Max}$, corresponding to a voltage $V_{CMax}$ at the output of the first operational amplifier, place the device in the reset state until the charge of the integration capacitor substantially reaches $Q_0$ The initial charge value $Q_0$ of the integration capacitor can be chosen equal to zero, but also to any value that is physically reachable in light of the supply voltage of the circuit.

The maximum charge value QMax, that the integration capacitor can have is a priori the maximum value that can be reached in light of the supply voltage of the circuit. However, the operator himself can choose in certain measurement circumstances to set a value of $Q_{Max}$ between $Q_0$ and the maximum value that can be reached in light of the supply voltage. It is therefore suitable to provide, in light of the sign of the current to be measured, a range of variations between $Q_0$ and $Q_{Max}$ in the direction that makes it possible to pass $Q_0$ and QMax under the effect of the current to be measured, and of which the difference $Q_{Max}-Q_0$ is suitable for the intensity to be measured.

The ground reference of the signals corresponds to a median potential between the supply voltages. When the circuit is supplied by a single power supply, this ground is chosen at a median potential that is created via resistors, this virtual ground potential can nevertheless be located anywhere between the supply voltages provided that the system remains in a linear operation. When the circuit is supplied by two symmetrical power supplies, this ground corresponds to their common point.

The term active current source means comprising semiconductors able to provide a power that is higher than the power of the signal that passes through it. This power difference then comes from a related circuit that supplies energy from a power supply. As such, the current injected into one direction or the other of the inverting input of the first operational amplifier comes from the power supply of this active circuit, a priori the same as that of the overall circuit according to the invention. Consequently, the point of injection of this current has a floating potential, i.e. it follows the one imposed upon it by the inverting input of the first operational amplifier. In practice it only moves less than a mV under normal conditions of use.

Figure 3:
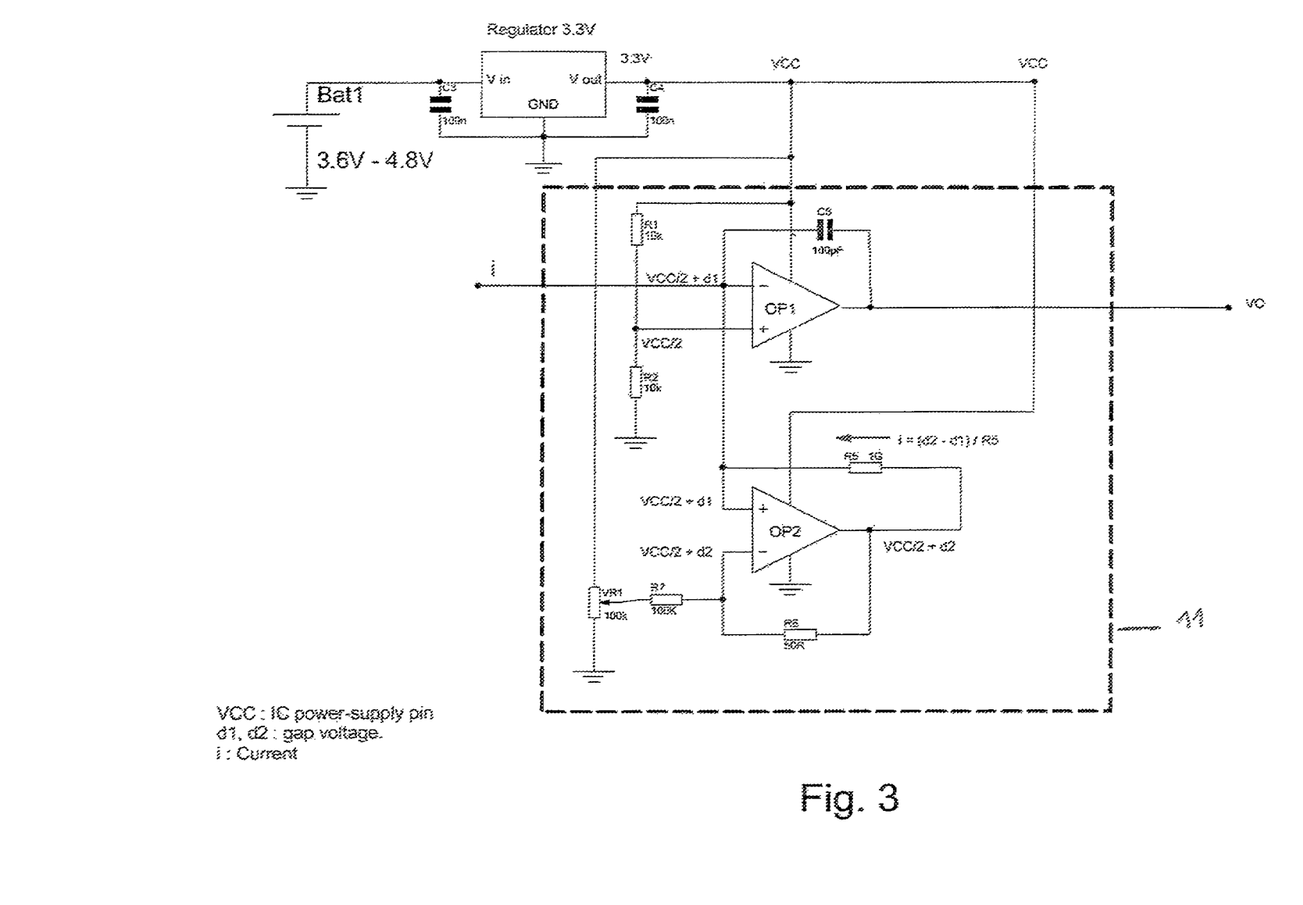
FIG. 3 diagrammatically shows the current source 11, placed in the basic embodiment of the invention.

More particularly, this current source comprises a second operational amplifier OP2, connected as a follower, such as shown in FIG. 3. Preferably these two amplifiers (OP1 and OP2) are integrated into the same case, as such they are at the same temperature. A preferred embodiment of this active current source is comprised of an operational amplifier OP2 connected as a follower and further comprising a low positive reaction, using a first high-value resistor R5 (greater than 500 MOhms, and typically 1 GOhm). This FIG. 3 shows the basic version of the invention, for which several advantageous improvements shall be described.

This basic version operates as follows: the second operational amplifier OP2 is connected as an inverting input voltage follower of the first operational amplifier OP1, with a very strong counter-reaction (very low resistance, zero here) between the output of the second operational amplifier and the inverting input of the second operational amplifier, in such a way as to have substantially unity gain. The voltage at the output of the second operational amplifier is therefore always equal to the non-inverting input voltage of the second operational amplifier, which is the same as the inverting input voltage of the first operational amplifier, with the physical imperfections close to the components. In reality, there is a slight offset of about a few hundred µV at most, which is quasi-constant and follows all of the variations in the input voltage of the inverting input of the first operational amplifier. It is on this offset that the current source is based.

The resistor R5 of high value, greater than 500 MOhms generally, here equal to 1 Gohms in the example of FIG. 3, is connected between the output of the second operational amplifier OP2 and the non-inverting input of the first operational amplifier OP1. As it has at its terminals a ddp (difference of potential) practically constant d2−d1 of a few hundred µV, it is passed through by a current i=(d2−d1)/R5, i.e. in numerical values $10^{-9}$ times a few $10^{-4}$V, i.e. a few $10^{-13}$ A. This current, which is injected into the inverting input of the first operational amplifier, is extremely stable, which makes it possible to compensate it for the most part with an offset circuit described hereinbelow. This circuit, such as shown in FIG. 3, comprised of OP2, of its counter reaction and of its reaction therefore does constitute a device that operates as a current source.

Furthermore, this current can be adjusted via an offset applied on the inverting input of the second operational amplifier OP2. This alternative is shown in FIG. 3. A first offset, which can be adjusted manually when the circuit is manufactured (factory setting by an operator), is comprised of a potential VR1 taken between the positive supply and the ground thanks to a potentiometer VR1 (typically 100 kOhms) in the cursor of which is connected in series a resistor R7 which assists in determining the gain applied by OP2 to this offset voltage. This gain has to be very low in light of the magnitudes at play in the current source. In order to not substantially modify the operation of this source, R8 must remain low so that OP2 has a gain very close to 1. However this gain, determined by the ratio R8/R7, has to be about a few thousandths so as to not induce an offset greater than a few fA on the inverting input of OP1. By way of example, with a gain of 0.001, 1 fA is obtained on the inverting input of OP1 for 1 mV of VR1. Moreover, by choosing R7 between 30 KOhms and 100 kOhms, and R8 at a few dozen Ohms, the gain of OP2 is about 0.001 (i.e. it operates as an inverting attenuator).

In light of the role played by R8, R7 and VR1 in the gain of OP2, R8, R7 and VR1 have to be stable in temperature and with precision better than 5%. With these constraints respected, the manual adjusting of the potentiometer VR1 makes it possible to offset the operating point of OP2, and by that to approximately compensate the leakage currents of the circuit to the inverting input of the first operational amplifier. This is verified by measuring the output voltage Vc of the first operational amplifier and the drift that it has before any application of a current to be measured. For the purposes of information, for an integrating capacitor of 100 pF, a current of 10 fA will produce a variation in Vc of 1 mV/10 s or 10 mV for 100 s. Such an operator setting is however required only just after manufacture, when leaving the factory, or possibly after an impact or an exceptionally taxing period for the equipment.

Figure 4:
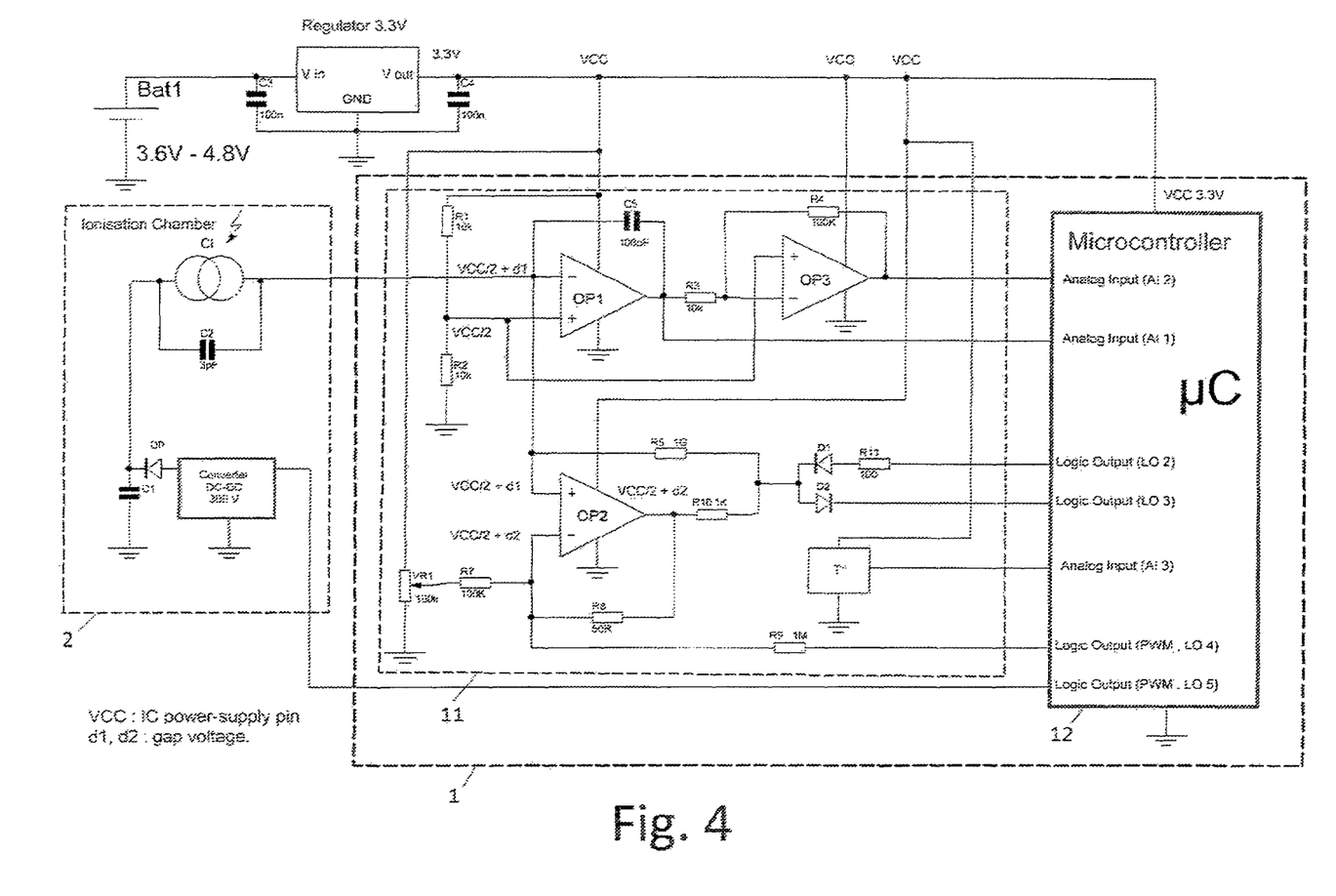
FIG. 4 shows the preferred embodiment of a current-measuring device by means of integration according to the invention provided with state switching by the circuit with diodes D1 and D2 and connected to an ionisation chamber.

The adjusting of the offset by R7 and VR1 is adjusted in order to compensate as much as possible the leakage currents when the circuit is in the measurement state, and to bring it into a range of about 1 to 10 fA. When the circuit of the invention is provided with a microcontroller to control the switching from one state to another, this microcontroller can advantageously deliver on a logic output LO4 PWM pulses of which the average value is added with the offset of R7 and VR1, as such automatically adjusting the current of the source so that it practically cancels the leakage currents on the inverting input of OP1 (FIG. 4). As with the previous devices of LNE, LNHB, the device or even devices of the Babyline or gas chamber type, the device according to the invention has two separate states. The first corresponding to the integration of the current to be measured via the charge of an integration capacitor (C1 in the prior art of FIG. 2, C5 in the invention of FIG. 3 and the following figures), of which the capacitor is referred to as integrating capacitor. This first state exists in the invention, and thanks to the current source described hereinabove allows for a better compensation of the leakage currents.

The second state for an amplifier by means of integration is the resetting of the charge of the integration capacitor to its starting value $Q_0$, since this charge cannot indefinitely increase under the effect of the current to be measured. In prior art, this reset is a sudden discharge of the integration capacitor, via a short-circuit between its electrodes, with this short-circuit able to be carried out through a low-value resistor intended to limit the peak value of the current. According to the invention, this reset state is no longer a short-circuit of the integration capacitor but a charge of the integration capacitor, in the reverse direction of the charge resulting from the current to be measured by means of a charge current in the opposite direction. This could be done laboriously through a temporary modification of the offset of the current source, for example by applying to the inverting input of OP2 an offset with a high value and of the appropriate sign, for example by means of another potentiometric bridge and a switch, not shown by a diagram as these are obvious for those skilled in the art. However this simple means would have little performance and would make it difficult to switch from one state to another. Furthermore, it is desirable that the reset current be much stronger and of the opposite direction than the current due to the measurement. This current cancels the cumulative effect of the charges integrated since the last reset, and replaces the charge value of the integration capacitor to its initial value $Q_0$. It is, for example, ten times, a hundred times, or a thousand times greater than the current to be measured, the returning to the capacitor of its initial value will be done ten times, a hundred times, or a thousand times faster. This value can therefore be modified in a very wide range without however leaving the scope of the invention: only the technology conditions of the circuits and the desired integration time limit this value. It must simply be ensured that a current is not requested that is so intense that it furthermore harms the stability of the circuit, which is trivial for those skilled in the art.

Figure 5:
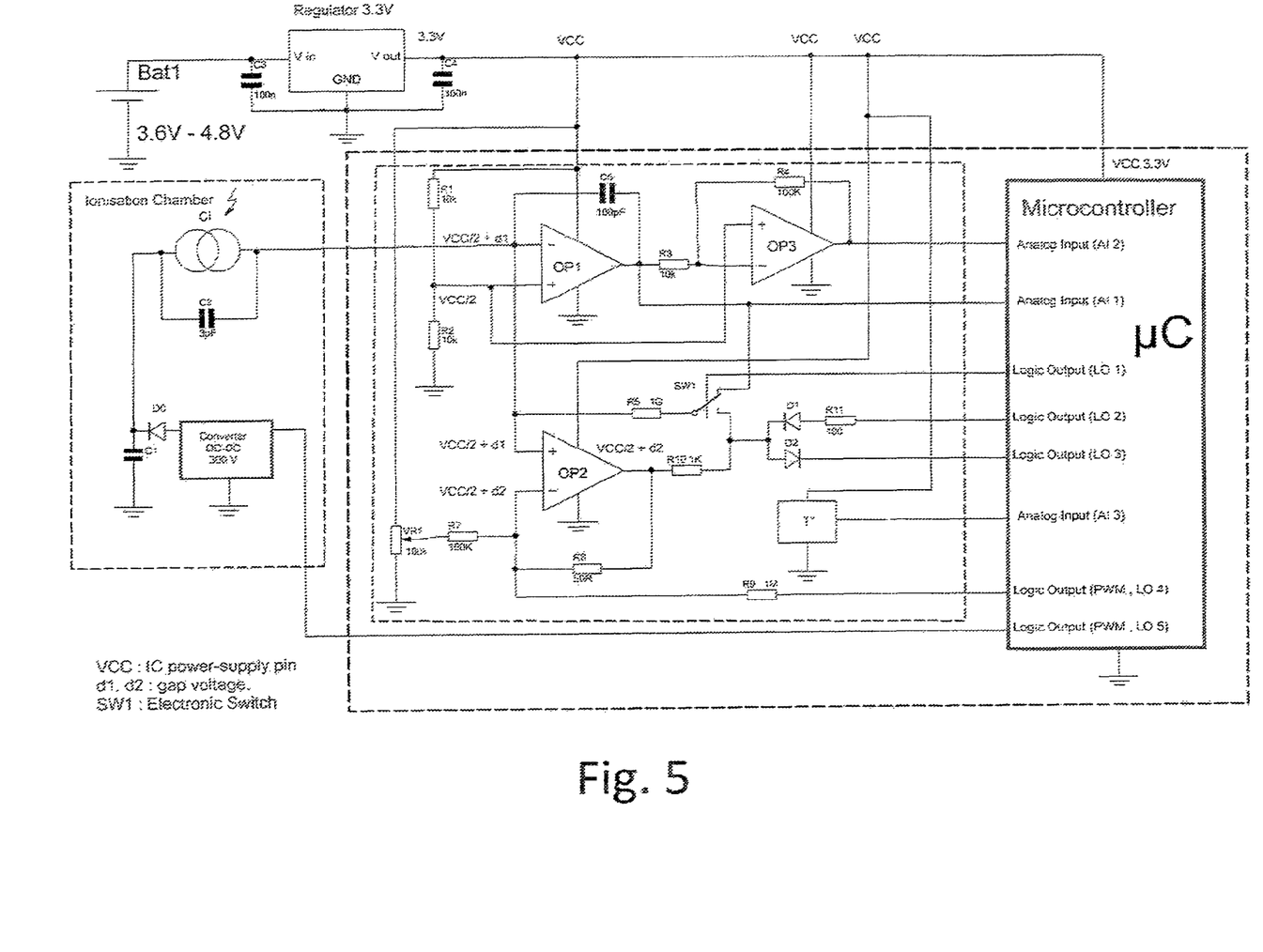
FIG. 5 shows the embodiment of a current-measurement device operating either by means of integration, or as a resistive transimpedance amplifier, and connected to an ionisation chamber.

Preferentially, this switching from one state to the other is done thanks to an improvement comprising two diodes D1 and D2 and a resistor R10 with a low value (typically 1 kOhm). FIGS. 4 and 5 show their installation in the circuit in the case where they are actuated by a microcontroller, which is very advantageous. However the invention can also be carried out by replacing the microcontroller outputs noted as LO3 and LO4 with logic voltages applied manually to the diodes D1 and D2 via manual action on switches or via logic circuits. As this simplified realisation is obvious for those skilled in the art, it has not been shown graphically. The diodes D1 and D2 shown in FIGS. 4 and 5, connected in the reverse direction starting at a common point to the output of OP2 (of which the potential is very close to Vcc/2), downstream of a resistor R10 of low value (typically 1 kOhm) and of which the other end is connected:

for D1, connected to the common point of the diodes D1 and D2 and to R10 via its cathode, the anode is connected via a protective resistor of low value R11 to a low logic level when the circuit is in its measurement state, and a high logic level when the circuit is in its reset state and when it is desired to inject into C5 a current in a first direction for D2, connected to the common point of the diodes D1 and D2 and to R10 via its anode, the cathode is connected to a high logic level when the circuit is in its measurement state, and a low logic level when the circuit is in its reset state and when it is desired to inject into C5 a current in a second direction.

These logic levels can be applied manually by switches, or by logic circuits, according to an arrangement that is obvious for those skilled in the art and therefore which does not need to be shown. However they are very advantageously applied by a microcontroller if the circuit according to the invention has one. This configuration is shown in FIGS. 4 and 5. In this case:

D1 has its anode connected via R11 (of about a hundred ohms) to a logic output LO2 of the microcontroller, brought to the low logic level when the circuit is in its measurement state, and to the high logic level when the circuit is in its reset state and when it is desired to inject into C5 a current in a first direction;

D2 has its cathode connected to a logic output of the microcontroller LO3 located at the high logic level when the circuit is in its measurement state, and at the low logic level when the circuit is in its reset state and when it is desired to inject into C5 a current in a second direction.

It is then the microcontroller that triggers the changes from one state to the other according to the charge state integration capacitor. This state is known to it since it directly controls the output voltage Vc of the operational amplifier OP1 connected as an integrator, and enters on its first analogue input AI1.

When the circuit is in the measurement state by means of integration, the two diodes D1 and D2 are polarised inversely by the control of the microcontroller. These diodes have a reverse current of about a few pA, but these currents are not rigorously identical and a current resulting from the difference is collected by the output of the OP2 via the resistor R10. This current passing through the resistor R10 creates a voltage that is added to or is put pack into in relation to the output of OP2. This results in a modification of the output voltage of OP2 of a few nano Volts, of which the effect on the current source is negligible.

In the second state of the circuit, referred to as reset, the microcontroller forces the rapid charge or the discharge of the integrating capacitor, according to whether it actuates one or the other of its logic outputs:

if the diode D1 conducts, the resistor R5 (1 GOhm) is brought to a potential equal to the supply voltage less the voltage drop in D1, i.e. VCC −0.6V, and charges the integrating capacitor with a current of about 1 nA;

if it is the diode D2 that conducts, the resistor R5 (1 GOhm) is brought to a potential of 0.6V and discharges the capacitor with a current of 1 nA. For a capacitor of 100 pF, the voltage can change by 1 V for 100 ms. This system does not make use of any mechanical or electronic contactor system.

In the second state the diodes D1 and D2 are never simultaneously passing. However they could accidentally be following a programming error or a microcontroller defect. In order to limit the current that could then circulate, the resistor R11, of a hundred or so ohms, is inserted in order to limit the current between the logic outputs of the microcontroller.

However, the invention has another advantageous characteristic that is entirely incompatible with the devices of prior art. It makes it possible to no longer be limited at a start state where the Q charge of the integration capacitor would be zero. Indeed, according to the invention the capacitor can have at the beginning of integration measurement a charge $Q_0$, which can be for example a charge of the opposite sign of the charge that can give rise to the current to be measured at the end of the integration state. At the maximum of the technical possibilities of the circuit, its value can be set to that of the maximum charge that can be reached $Q=CV_{max}$, where $V_{Max}$ is the maximum voltage at which the integration capacitor can be charged, but with a sign opposite the side of the change of the charge under the effect of the current to be measured. As such, if the current to be measured decreases the charge, the integration capacitor can be initially precharged to a positive value equal to $CV_{Max}$. This allows the device according to the invention a measuring extent that is double that of the devices of prior art.

To summarise this second state according to the invention, it can be characterised by the absence of modification of the connections of the integration capacitor on itself and the associated operational amplifier between the two states wherein it can be located. But it can also be characterised by the capacity of the current source to generate a current which can put the first integrating capacitor in a $Q_0$ initial charge state when the effective charge of this capacitor reaches a maximum value $Q_{Max}$. In other terms, in this reset state, the current source of the invention is able to inject into the integration capacitor a current of at least K times greater than the current to be measured, and in the suitable direction to put at least K times faster the integration capacitor in the $Q_0$ charge state, which constitutes a reset of the device. The value K is at least equal to 10, but more generally about 100, 1000 or even more, according to the measurements to be taken. The invention therefore comprises a current source which can place the integrating capacitor C5 in all of the possible charge values $Q_0$, whether at the start or in each reset state. This charging of the integration capacitor to $Q_0$ constitutes a reset of the device which allows again switching in the first state hereinabove referred to as measurement state.

The maximum value of the output voltage of OP1 is qualified at the end of the measuring extent by its absolute value. Indeed, the invention makes it possible to start from any $Q_0$ charge state, with the end of the measuring extent then being the maximum charge value $Q_{Max}$ that the integration capacitor can reach in light of the supply voltages of the circuit. If the direction is known wherein the current to be measured will modify this charge, the invention makes it possible to choose to place the charge $Q_0$ at the maximum possible value in the reverse direction, in such a way as to have the widest range of variations possible between $Q_0$ and $Q_{Max}$.

The analogue voltage output from the first operational amplifier represents all of the current to be measured by the device. The high threshold value $V_{Max}$ can be configured and can be memorised by the microcontroller for example. The microcontroller switches the device in the measurement state or in the reset state by sending a logic signal (digital).

FIG. 4 diagrammatically shows a preferred embodiment where this switching is controlled by the microcontroller thanks to a first diode D1 and a second reverse-polarised diode D2, and the resistor R10 placed between the common point of these diodes and the output of the second operational amplifier OP2. The anode of the first diode D1 is connected to a first logic output of the microcontroller, and the cathode of the second diode D2 is connected to a second output of the microcontroller, the first and second outputs of the microcontroller then allow for the control of the switching of the device between the initialisation state and the measurement state. This switching functions as follows. In the integration state of the circuit, the two diodes D1 and D2 are reverse polarised. They then each have a reverse current of about a few pA, but which are not entirely equal from one diode to the other. The difference between the two reverse currents is a resulting current that is algebraically added to the output current of OP2, via the resistor R10. It is chosen with a value that is sufficiently low so that the ddp generated as such at the terminals of R10 do not substantially disturb the operation of the current source. Typically, R10 is of about 1 Kohm, which generates at the terminals of R10 a few nano Volts. However, if diodes are chosen of which the reverse leakage current is greater than 1 pA, the difference of the currents can be slightly sensitive to the temperature.

In the measurement state of the circuit according to the invention, the logic output LO2 of the microcontroller associated with D1 is at low state and the logic output LO3 associated with D2 is in high state. In the reset state, if the microcontroller places at high level its logic output LO2 (connected to the anode of D1 via a protective series resistor), then D1 conducts and the resistor R5 (typically 1 Gohm) is brought to a potential of VCC −0.6V, which charges the integrating capacitor C5 with a current of 1 nA.

In the reset state, if on the contrary the microcontroller places at the low level its logic output LO3, the diode D2 conducts. The end of the resistor R5 connected to D2 is then brought to a potential of 0.6V, which causes in it a current of 1 nA which discharges the integrating capacitor C5 with a current of 1 nA.

This value of one nA is very suitable for a capacitor C5 of 100 pF, in which case the voltage at its terminals can change at a rate of 1 V for 100 ms. It is easy to adapt it to another value of C5 or to a different charge/discharge current.

This connection with two diodes and a resistor R10 does not make use of any mechanical or electronic contactor system. For safety reasons, with D1 a resistor R11 is placed of about 100 ohms in series which limits the current between the outputs of the μcontroller in the case where the two diodes would unfortunately be polarised directly (for example in the case of a programming error of the μcontroller). With this improvement, the microcontroller controls the switching in the measurement state or the reset state of the device by means of two separate logic outputs.

According to another improvement, that applies to connections intended to receive the current of an ionisation chamber, and which can be combined with the previous improvements, the microcontroller is able to control the polarisation voltage of the chamber thanks to pulse width modulation (PWM) generated by a fourth logic output (LO5). These pulses are configured to generate an average voltage which can control the polarisation voltage source. This source can for example be carried out using a DC-DC converter according to the known technique of a stage with a step-up transformer and pumping by diodes and capacitors.

According to another improvement that can be combined with the preceding improvements which comprise a microcontroller, this microcontroller is able to maintain practically at zero the leakage currents in the absence of a current signal to be measured using a third logic output (LO4), operating as the fourth logic output (LO5) in PWM. Attenuated by a resistor R9 of about a MOhm, it brings to the inverting input of the second operational amplifier OP2 an offset that is added to that supplied by the potentiometer VR1 and the resistor R7. This offset is sufficient to maintain at a very low value (typically of about 10 fA) the leakage currents at the inverting input of the first operational amplifier OP1.

Preferentially, the device also comprises a means for measuring thermal drifts of said device, said means for measuring thermal drifts being connected to an input of the microcontroller. The means for measuring thermal drifts is for example a temperature sensor arranged in the vicinity or against the case comprising the first operational amplifier, and the output signal of the means for measuring thermal drifts is applied to an input of the microcontroller so that the latter can compensate the thermal drift by acting on the current source by the means mentioned hereinabove. If the amplifiers OP1 and OP2 are in the same case, the measurement of the temperature is improved.

According to an alternative, the circuit according to the invention can also operate according to a third state referred to as resistive transimpedance amplifier (shown in FIG. 5). The passing into this third state can be controlled by a single-pole changeover switch SW1, preferably electronic. Its central contact is connected to the end of R5 not connected to the non-inverting input of OP2, and makes it possible to connect this electrode either to the common point between D1 and D2 in order to obtain an operation of the circuit as a current measurer by means of integration, or to the output of OP1 in order to obtain an operation of the circuit as a transimpedance amplifier. When this switch SW1 is electronic, it is preferentially controllable by the microcontroller.

Indeed, in the case of the connection of the central contact with the output of OP1, the resistor R5 is parallel with the integration capacitor C5, of which the influence is low at the working speeds of the circuit. C5 is then used to smooth the parasite signals of a higher frequency. This corresponds to the third operational state of the circuit, wherein OP1 no longer operates as an integrator but as a resistive transimpedance amplifier, with for counter-reaction resistor R5. The switching into this third state can be carried out manually by an operator. However, if the circuit comprises a microcontroller, it can advantageously be controlled by an electromechanical or semiconductor switch actuated by this microcontroller.

When the circuit according to the invention has a microcontroller, the latter is advantageously provided with two analogue-to-digital converters, which makes it possible to have, in addition to the first measurement channel corresponding to the output of OP1 entering on a first analogue input, a second more sensitive measurement channel corresponding to this same output of OP1 which was amplified, for example by a factor 10, by a third operational amplifier OP3 of which the output enters on this second analogue input of the microcontroller.

The invention also relates to a system for measuring current by means of integration, said system comprising an ionisation chamber wherein circulates the current and a device for measuring current by means of integration according to one of the previously described embodiments.

BRIEF DESCRIPTION OF THE FIGURES

Other characteristics and advantages of the invention shall appear when reading the following description, in reference to the annexed drawings that show.

For more clarity, identical or similar elements are marked with identical reference signs on all of the figures, except for FIG. 1 which covers prior art.

DETAILED DESCRIPTION OF AN EMBODIMENT

FIG. 1 shows the electronic diagram of the anteriority that charges and discharges very frequently the integration capacitor, and emits at the end of each charge cycle a pulse going through the output 10 to metering electronics. It is only the number of these pulses that gives an evaluation of the current to be measured. The logic ports U1B and U1C give a polarisation pulse that cooperates with the diode D1 (PAD 1).

FIG. 2 shows a block diagram from prior art that carries out like the invention a genuine continuous measurement of the input current. The ensemble formed by the potentiometer VR1 and the resistor R1 constitutes a polarisation that aims to compensate for leakage current. The integration capacitor C1 is, when it charged to the maximum, reset by a short circuit between its electrodes by the switch SW0, which is necessarily a mechanical contact actuated by an electromagnet for the most precise applications. Indeed, a static switch has in the open state a non-negligible leakage current in front of the current to be measured.

FIG. 3 shows the most basic embodiment of the invention. Mention has not been made of the system for memorising the $Q_0$ initial charge state corresponding to a voltage $V_{C0}$ at the output of the first operational amplifier, since in this case the memorising is done by the intervention of an operator. Idem for the additional offset to be applied to the inverting input of OP2, by means of a manual or semiconductor switch connected to a polarisation voltage that is suitable for the current source to produce the current able by its sign and its amplitude to charge the capacitor to the initial value $Q_0$. This configuration imposes a monitoring of the value of the charge of C5 either by the operator or by a banal related circuit to be carried out by those skilled in the art. In FIGS. 4 and 5, the circuit of the invention properly speaking 11 (central box) is associated with an ionisation chamber by way of a non-limiting example. The box 2 diagrammatically shows an ionisation chamber CI, and its polarisation supply with voltage. The parasite capacitor of CI has been diagrammed by C2. The current-measurement device of the central box 11 is also connected to an element of lithium accumulator Bat1 of 3.6V nominal (or with four NIMH accumulators of 4.8V in total). Finally it is also connected to a regulated power supply of 3.3V for the supply of the active components of the measurement device.

The current to be measured is output from the ionisation chamber CI and is sent into the device for the measurement thereof. The measurement device 1 comprises an electronic circuit portion 11 and a portion for the means for controlling. If in the most basic version this can be carried out by an operator, a more elaborate version can use basic logic circuits to provide these functions. However, diagrams 4 and 5 show them here comprised of a microcontroller 12.

In FIGS. 4 and 5, the electronic circuit 11 comprises a first operational amplifier OP1. The first operational amplifier OP1 is supplied with a source of direct voltage, here delivering a stabilised voltage Vcc=3.3V. The current to be measured is sent on the inverting input of the first operational amplifier OP1. Due to the voltage divider bridge constituted by the resistors R1 and R2 of 10 kohms each, the inverting input and the non-inverting input of the first operational amplifier OP1 are at the potential Vcc/2 for the non-inverting input and Vcc/2+d1, with d1 representing the differential input voltage of the first operational amplifier.

A first capacitor C5 is connected as counter-reaction on the first operational amplifier OP1, i.e. between the inverting input and the output of the first operational amplifier OP1. As explained hereinabove, this stage of the circuit constitutes an integrator. The voltage at the terminals of the integrating capacitor C5 represents all of the current to be measured, and determines the output voltage Vc of the operational amplifier OP1. By drifting this voltage, it is possible to obtain the average value of the current in the cases where this value is too low for a direct measurement, as is the case for the output of an ionisation chamber.

The circuit 11 also comprises a third operational amplifier OP3 connected at the output of the first operational amplifier OP1 connected as an inverting amplifier with a gain adapted according to the desired operating range for the first capacitor referred to as integration C5. Between the output of OP1 and the inverting input of OP3, there is a third resistor R3 of 10 kOhms and between the third resistor R3 and the output of the third operational amplifier OP3, there is a fourth resistor R4 of 100 kOhms. As such the voltage at the output of the third operational amplifier OP3 is equal to ten times the voltage at the output of the first operational amplifier OP1, this makes it possible to obtain a zoom effect when the current to be measured is very low. Indeed, in order to prevent the risks of saturating the circuits, it is sought to have a voltage operating range of the first capacitor ranging from 0.1 to 0.9 times the power supply voltage of the circuit. If the currents to be measured are very low (a few fA), the change in the voltage on the integrating capacitor C5 is slow, either by construction the value of the first capacitor can be decreased, or the output of the third amplifier OP3 will be used, due to its voltage amplifying nature, the change in the voltage is multiplied by 10 which makes it possible to divide the integration time by 10. This makes it possible to bring the measurement time of the current coming from the ionisation chamber to a comfortable value for the operator, i.e. for a portable measurer: a time that hardly exceeds one minute for the lowest levels.

It is not necessarily required to pass by an amplified value of the output voltage of the first operational amplifier OP1 in order to take the voltage measurement. Indeed, for an ionisation chamber that has a radiation of 0.1 Gy/h, a portable measurer of the Babyline type provides a variation of an unamplified output signal (at the output of OP1) of 5V/s. In this case, it is not necessary to amplify the output voltage of OP1, the measurement can be taken directly (by sending it on an analogue input of the microcontroller µC). Furthermore, in this case, the output voltage of the third operational amplifier OP3 is saturated and therefore not taken into account by the microcontroller µC. The microcontroller comprises a first analogue input AI1 connected to the output of the first operational amplifier OP1 in order to receive the first analogue tension Vc of the first operational amplifier OP1. The microcontroller also comprises a second analogue input AI2 connected to the output of the third operational amplifier OP3 so as to be able to also work when the current to be measured is very low (cf. explication hereinabove for the zoom effect practiced by the third operational amplifier OP3).

The electronic circuit 11 also comprises a current source that can be controlled by the microcontroller comprised, in this embodiment, by a second operational amplifier OP2. The OP2 fulfils four simultaneous functions: 1) Non-inverting follower 2) current source (R5) 3) Inverting attenuating summator (VR1, R7, R8, R9) 4) Eliminates the influence of the leakage currents of the diodes D1 and D2 (R10). The first function of OP2 is to follow the voltage at the terminal of the inverting input of OP1, the + input of OP2 is connected to the inverting input of OP1 and the output of OP2 is connected to its inverting input by a resistor of 50 Ohms. The second function of OP2 is to generate a constant current in the inverting input of OP1, the voltage between the + input and the output of OP2 is slightly different <1 mV). Via the resistor R5, a current of several dozen fA will be injected into the input of OP1 in order to vary the current, the output voltage of OP2 will be offset by the inverting attenuating summator constituted by VR1, R7, R8, for 1 mV in variation on VR1 there is 1 µV at the output of OP2 which will produce a current variation of 1 fA on the inverting input of OP1 via R5. This adjusting is manual and will be carried out when leaving the factory or during a calibration of the device. This adjusting makes it possible to return the input current on the inverting input of OP1 to a dozen fA. In addition, a logic output of the microcontroller with pulse width modulation (PWM) will be connected to the resistor R9, with this modulation added to the input of the sommator, will also modify the current generated and injected on OP1, this function is required to correct any possible variations of the leakage current in particular due to the effects of temperature. The last function of OP2 is in the integration mode, (measurement) pumping, via R9, the reverse differential current of the diodes D1 and D2. This current passing through R10 will not have any substantial influence on the current of the source. Remains the charge or discharge function of the integrating capacitor (C5), this function is provided by two logic outputs of the microcontroller, by the two diodes D1 and D2 and par R10.

In the measurement state (integration) of the circuit, the diodes D1 and D2 are reverse polarised. They each have a reverse current of about a few pico amperes, preferably less than the pA. The anode of the first diode D1 is connected to a first logic output LO2 of the microcontroller and the second cathode of the second diode D2 is connected to a second logic output LO3 of the microcontroller. In the reset state, one or the other of these two logic outputs switches in order to charge the integrating capacitor in one direction of the other, in order to bring its charge to the initial value $Q_0$. It is by this switching of one or the other of these logic outputs that the microcontroller can cause the circuit to leave the measurement state and switch to the reset state, and control the direction of the reset according to whether it is the state of LO2 or LO3 that is switched. The currents passing through the first and second diodes are not absolutely identical, as such a current that results from their difference returns via the resistor R10 to OP2; this current produces a voltage of a few nV which has a negligible influence on the current source. When the first diode D1 conducts and the second diode D2 does not conduct, the resistor R5, referred to as counter reaction, is brought to a potential of Vccc-0.6V and as such charges the first capacitor C5 with a current of 1 nA. If the second diode D2 conducts, and the first diode D1 does not conduct, the counter-reaction resistor R5 is brought to a potential of 0.6V and discharges the first capacitor C5 with a current of 1 nA. As such the current-measurement device does not use any mechanical contactor for the resetting of the circuit current. An eleventh resistor R11 is arranged between the second output LO2 of the microcontroller and the first diode D1 in order to limit the current between the second and third outputs of the microcontroller if the diodes were polarised directly, in the event of a programming error of the microcontroller.

The device can also comprise, such as shown in FIG. 5, a first electronic switch SW1 arranged between the output of the second operational amplifier OP2 and the fifth resistor R5. This switch makes it possible to switch the central contact connected to the end of R5 either to the output of the second operational amplifier OP2 for the operation of the device as measurement by means of integration such as described hereinabove; or to switch to C5 and the output of the first operational amplifier OP1. In this case the fifth resistor R5 is parallel with the integrating capacitor C5 and its effect predominates the low frequencies used for the measurements. The effect of C5 is limited to a slight smoothing of any parasite fluctuations. As such in this latter case, there is a transimpedance amplifier of which the first capacitor plays the role of filtering any parasites. The switch SW1 is preferentially controlled by the microcontroller by means of a first logic output LO1.

When the device is first turned on, leakage currents appear since they are imperfectly offset. But they are stable over time, which allows an operator in the factory to offset them for the most part via an action on VR1 which constitutes an offset of the circuit current source around OP2, as seen hereinabove. This makes it possible to vary by a few microvolts the voltage at the output of the second operational amplifier OP2 and as such bring the leakage currents to some twenty femto amperes or even a few fA. However when the connection comprises a microcontroller, a margin to manoeuvre is left of about + or −80 fA and it is preferred to leave the PWM at a cycle ratio of about 50%, and the self-regulating action of the current source will reduce this value to a few fA. This is for a circuit carried out with standard components, except for a few specifications that are more precise given hereinabove. It is obvious that with the measurement operational amplifiers, this value will be reduced. The same applies if passive components are used that are more precise and more stable than what was mentioned hereinabove as a minimum condition.

The microcontroller also comprises a third logic output (LO4) which can deliver pulse width modulation (PWM) connected to the inverting input of the second operational amplifier by means of a ninth resistor R9 between 500 kOhms and a few MOhms. In our example, it is 1 MOmhs. These pulses deliver an average voltage (at the measurement frequencies considered) which constitutes a second offset in parallel with the manual circuit offset of VR1 and R7. The microcontroller can then be configured to act on the cycle ratio of the PWM pulses in order to cancel the leakage currents on the inverting input of OP1.

The invention is not limited to the embodiments described hereinabove and in reference to the figures and alternatives can be considered without leaving the scope of the invention.

The invention claimed is:

1. A device for measuring current by means of integration, said device comprising:
    a first operational amplifier comprising a first inverting input, with the current to be measured being applied on said first inverting input;
    an integration capacitor arranged between the first inverting input of the first operational amplifier and an output of said first operational amplifier;
    an active current source connected to the first inverting input of the first operational amplifier, with the current source being configured to:
        in a first measurement state of the device, compensate for leakage current of the device;
        in a second reset state of the device, triggered by a charge value of the integration capacitor substantially equal to a maximum value $Q_{Max}$ that is reachable by the integration capacitor, generate a current which is adapted to return said charge to its initial value $Q_0$;
    a control system configured to:
        memorize a $Q_0$ initial charge state of the integration capacitor, corresponding to a voltage Vco at the output of the first operational amplifier;
        place the device in the measurement state and keep it there until the charge of the integration capacitor substantially reaches $Q_{Max}$, corresponding to a voltage $V_{CMax}$ at the output of the first operational amplifier;
        when the charge of the integration capacitor substantially reaches $Q_{Max}$, corresponding to a voltage $V_{CMax}$ at the output of the first operational amplifier, place the device in the reset state until the charge of the integration capacitor substantially reaches $Q_0$.

2. The device according to claim 1, wherein the active current source comprises a second operational amplifier connected as a follower, said second operational amplifier further comprising a positive reaction by means of a first resistor R5 with a value greater than 500 MOhms.

3. The device according to claim 2, wherein an output of the second overational amplifier of the current source is connected, after a resistor R10 of about 1 kOhm, to two diodes D1 and D2 connected as follows:
    for D1, connected to a common point of the diodes D1 and D2 and to R1 by its cathode, an anode of D1 is connected via a protective resistor of low value R11 to a low logic level when the circuit is in its measurement state, and a high logic level when the circuit is in its reset state and when it is desired to inject into first capacitor C5 a current in a first direction;
    for D2, connected to the common point of the diodes D1 and D2 and to R10 by its anode, a cathode of D2 is connected to a high logic level when the circuit is in its measurement state, and a low logic level when the circuit is in its reset state and when it is desired to inject into the first capacitor C5 a current in a second direction.

4. The device according to claim 3, wherein the control system comprises a microcontroller configured to control a passing of a reset current of the first capacitor C5 in one direction or in the other thanks to the diodes D1 and D2, and wherein logic levels to which are brought the anode of D1 via R11, and the cathode of D2 are each applied by a logic output of the microcontroller.

5. The device as claimed in claim 3, wherein the device is switchable into an transimpedance amplifier state thanks to an electronic switch SW1 of which a central contact is connected to an end of R5 not connected to the non-inverting input of the second operational amplifier, and makes it possible to connect said contact either on the common point between the first diode D1 and the second diode D2 in order to obtain an operation of the circuit as a current measurer by means of integration, or on the output of the first operational amplifier in order to obtain an operation of the circuit as a transimpedance amplifier, with said electronic switch being controllable by the microcontroller.

6. The device according to claim 3, further comprising a system to measure heat drifts T of said device, said system to measure heat drifts T being connected to an input of the microcontroller.

7. A system for measuring current by means of integration, said system comprising:
    an ionisation chamber wherein the current circulates; and
    a device for measuring current by means of integration as claimed in claim 1.

* * * * *